United States Patent [19]

Kirisawa

[11] Patent Number: 5,446,415
[45] Date of Patent: Aug. 29, 1995

[54] INTERMEDIATE FREQUENCY AMPLIFIER CIRCUIT

[75] Inventor: Akihiro Kirisawa, Tokyo, Japan

[73] Assignee: NEC Corporation, Japan

[21] Appl. No.: 234,050

[22] Filed: Apr. 28, 1994

[30] Foreign Application Priority Data

Apr. 28, 1993 [JP] Japan .................. 5-102423

[51] Int. Cl.$^6$ .............................................. H03F 3/191
[52] U.S. Cl. ................................ 330/302; 330/306; 330/174
[58] Field of Search ............... 330/174, 302, 305, 306; 455/339, 340, 341

[56] References Cited

U.S. PATENT DOCUMENTS

| 3,375,456 | 3/1968 | Frisch | 330/174 |
| 3,727,154 | 4/1973 | Dailing et al. | 330/174 X |
| 4,227,156 | 10/1980 | Mattfeld | 330/174 X |
| 4,268,807 | 5/1981 | Spence | 330/174 X |

Primary Examiner—Steven Mottola
Attorney, Agent, or Firm—Ostrolenk, Faber, Gerb & Soffen

[57] ABSTRACT

In an intermediate frequency amplifier circuit having a crystal filter and a transistor amplifier, a tuning circuit including a coil and a capacitor is provided therebetween, and a current feedback resistor and a voltage feedback resistor are connected to the amplifying transistor. The resistance component of impedance is matched between the crystal filter and the amplifier by suitably selecting values of the resistors. Further, the reactance component of the impedance is matched therebetween by suitably selecting values of the coil and the capacitor. Thus, it is possible to obtain impedance matching between the crystal filter and the amplifier without degradation of NF and hence S/N ratio due the thermal noise caused by resistance elements in a conventional resistive attenuator which is conventionally used for impedance matching.

15 Claims, 1 Drawing Sheet

INTERMEDIATE FREQUENCY AMPLIFIER CIRCUIT

BACKGROUND OF THE INVENTION

The present invention relates to an intermediate frequency amplifier circuit and, particularly, to an amplifier circuit which receives an intermediate frequency output through a crystal filter used for a satellite communication facility.

It is known in a conventional intermediate frequency amplifier circuit that, as shown in FIG. 1, a resistor network circuit 4 is inserted in between a crystal filter 1 and an amplifier 5 to perform an impedance matching therebetween. In this case, an amplifying element in the amplifier 5 is a transistor 7. Since an output impedance of the crystal filter 1 is in the order of 75 Ω while an input impedance of the amplifier 5 is in the order of several kΩ, band characteristics of the intermediate frequency amplifier circuit will be degraded due to impedance mismatching if they are connected directly. Therefore, such impedance matching by means of the resistor network circuit is necessary. In order to make the impedance matching in the intermediate frequency amplifier circuit as reliable as possible, the resistor network circuit is usually constituted with a π type attenuator.

In such a conventional intermediate frequency amplifier circuit, a signal from the crystal filter is attenuated by the attenuator 4 and thus a gain of the whole intermediate frequency amplification is lowered. Further, the noise figure (NF) is degraded by thermal noise generated by the resistance thereof, resulting in degradation of the SN ratio.

SUMMARY OF THE INVENTION

An object of the present invention is to provide an intermediate frequency amplifier circuit which can solve the problems of signal attenuation and degradation of the noise figure and SN ratio.

According to an embodiment of the present invention, there is provided an intermediate frequency amplifier circuit comprising a crystal filter for receiving an intermediate frequency signal, an intermediate frequency amplifier for receiving the output of the crystal filter, a tuning circuit composed of a coil and a capacitor and provided between the crystal filter and the intermediate frequency amplifier, a current feedback resistor and a voltage feedback resistor.

DETAILED DESCRIPTION OF A PREFERRED EMBODIMENT

An embodiment of the present invention will be described with reference to the accompanying drawings.

Figure 1:
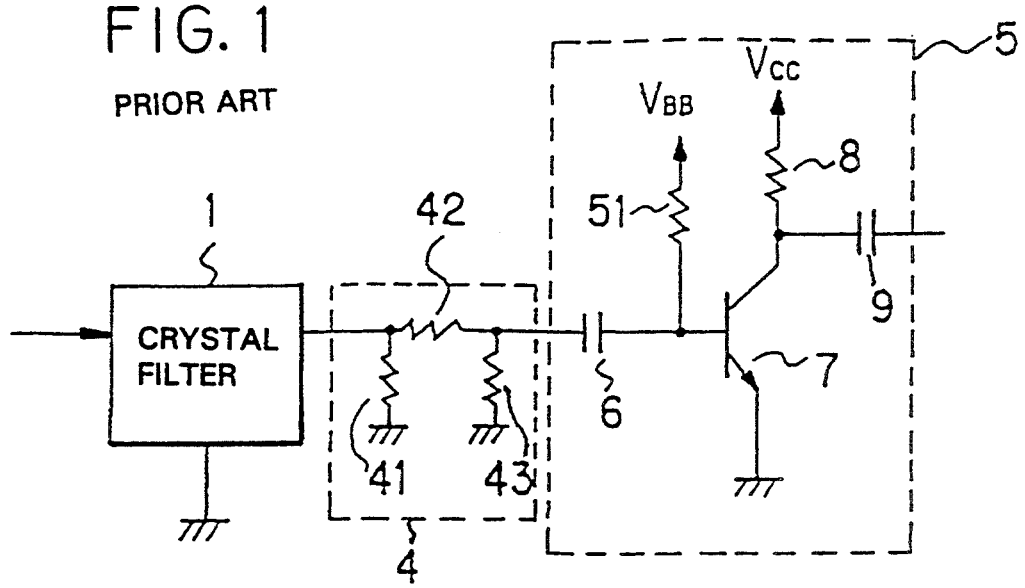
FIG. 1 is a circuit diagram showing an example of a conventional intermediate frequency amplifier circuit.
Figure 2:
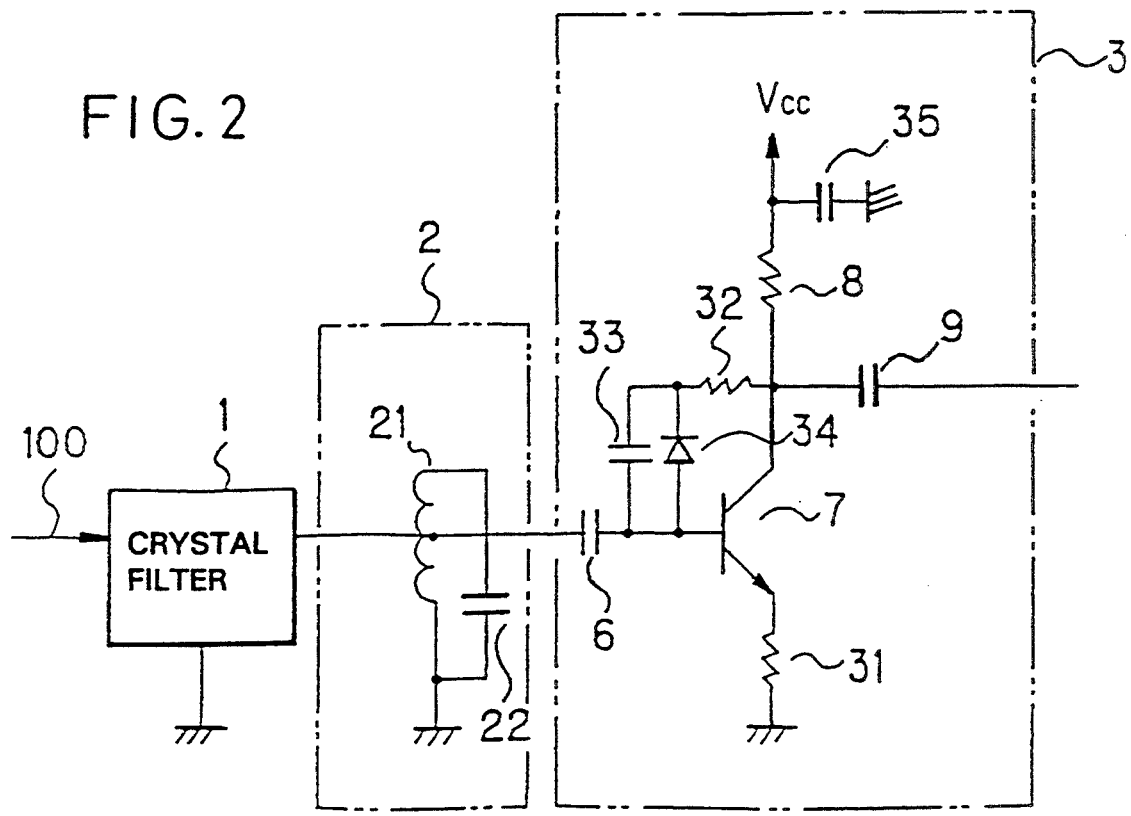
FIG. 2 is a circuit diagram showing an embodiment of the present invention.

Referring to FIG. 2 showing an embodiment of the present invention, an intermediate frequency amplifier circuit comprises a crystal filter 1, a tuning circuit 2 and an amplifier 3. A signal 100 having an intermediate frequency in the 90 MHz band is input to the crystal filter 1 which is a narrow band-pass filter and passes a desired narrow frequency from among the input frequencies to a subsequent stage. The tuning circuit 2 includes a coil 21 and a capacitor 22. A transistor 7 serves as an amplifying element in the amplifier 3. In the amplifier 3, a resistor 31 feed back current to the transistor 7 and a resistor 32 feed back voltage to the transistor 7. Capacitors 6 and 9 function to block D.C. components and a Zener diode 34 functions to bias the transistor 7. A resistor 8 is a load resistor and a capacitor 33 is a bypass capacitor. An output impedance of the crystal filter 1 is here 75 Ω.

In the embodiment, values of resistors 31 and 32 are determined such that an input resistance of the amplifier 3, which includes the transistor 7 as its amplifying element, is matched with an output resistance of the crystal filter 1. When the value of the resistor 31 is large, the input resistance of the amplifier 3 becomes large and, when the value of the resistor 32 is large, the input resistance of the amplifier 3 becomes small. Therefore, it is possible to match the output resistance of the crystal filter 1 with the input resistance of the amplifier 3 by suitably selecting the values of the resistors 31 and 32.

Although, as mentioned, it is possible to match the output resistance of the crystal filter 1 with the input resistance of the amplifier 3 by suitably selecting the values of the resistors 31 and 32, it is necessary in practice to obtain a reactance matching because of internal stray capacitance and parasitic inductance, etc., of the transistor 7. According to the present invention, the attributes of the tuning circuit 2 are changed to obtain this compensation. Namely, the tuning circuit 2 can be made either capacitive or inductive by changing the values of the coil 21 and the capacitor 22 from a tuning point thereof. In the embodiment shown in FIG. 2, practical values of the resistors 31, 32 and 8, the coil 21 and the capacitor 22 are 47 Ω, 10 kΩ, 680 Ω, 500 mH and 5 pF, respectively. In this case, though the tuning circuit 2 itself has the resonance frequency of about 100 MHz, the combination of the tuning circuit 2 and the amplifier 3 operates as a resonance circuit of 90 MHz due to the internal stray capacitance and the parasitic inductance in the amplifier 3. Therefore, it is possible to obtain reactance matching between the crystal filter 1 and the transistor amplifier 7 by suitably selecting the inductance of the coil 21 and the capacitance of the capacitor 22.

As mentioned above, the impedance matching between the crystal filter 1 and the amplifier 7 is obtained without using an attenuator composed of resistors. Further, in the present invention, since the tuning circuit 2 includes the coil 21 and the capacitor 22, even when an undesired signal passes through the crystal filter 1 due to parasitic resonance thereof, the tuning circuit 2 can remove it.

As described in detail, in the present invention, the resistance matching between the crystal filter and the transistor amplifier is performed by means of the current and voltage feedbacks circuits associated with the transistor and, further, the reactance matching therebetween is obtained by the tuning circuit having the coil and the capacitor. Accordingly, the impedance matching between the crystal filter and the transistor amplifier can be obtained without signal loss. With the intermediate frequency amplifier circuit according to the present invention, the NF is improved compared with that of the conventional circuit and also the S/N ratio is improved. Further, an undesired signal passed through the crystal filter 1 due to parasitic resonance thereof can be removed by the tuning circuit.

What is claimed is:

1. An intermediate frequency amplifier arrangement comprising:
    a crystal filter for passing an intermediate frequency signal;
    a transistor amplifier for amplifying the intermediate frequency signal;
    a tuning circuit for matching the reactance between said crystal filter and said transistor amplifier, including a coil and a capacitor and being provided between said crystal filter and said transistor amplifier; and
    an impedance matching circuit for matching the resistive impedance between said crystal filter and said transistor amplifier, including a series feedback resistor and a shunt feedback resistor associated with said transistor in said transistor amplifier.

2. An intermediate frequency amplifier arrangement comprising:
    a crystal filter for passing an intermediate frequency signal;
    a transistor amplifier for amplifying the intermediate frequency signal, comprising a transistor, a series feedback resistor and a shunt feedback resistor, said transistor being grounded through said series feedback resistor and having a collector connected to a power source and a base connected to an output of said crystal filter;
    a parallel circuit composed of a Zener diode and a capacitor, said parallel circuit being connected in series with said shunt feedback resistor to form a series circuit, said series circuit being inserted between said base and said collector of said transistor; and
    a tuning circuit having a coil and a capacitor and being provided between said crystal filter and said transistor amplifier.

3. An intermediate frequency amplifier arrangement as claimed in claim 1, wherein a tuning frequency of said tuning circuit is shifted from a characteristic frequency of said crystal filter.

4. An intermediate frequency amplifier arrangement as claimed in claim 2, wherein a tuning frequency of said tuning circuit is offset from a characteristic frequency of said crystal filter.

5. An intermediate frequency amplifier arrangement as claimed in claim 4, wherein said tuning frequency of said tuning circuit is higher than said characteristic frequency of said crystal filter.

6. An intermediate frequency amplifier arrangement as claimed in claim 3, wherein said coil and capacitor have values selected to coact with a capacitance of said transistor amplifier to give said tuning circuit and said amplifier a combined resonant frequency corresponding to said characteristic frequency of said crystal filter.

7. An intermediate frequency amplifier arrangement as claimed in claim 4, wherein said coil and capacitor have values selected to coact with a capacitance of said transistor amplifier to give said tuning circuit and said amplifier a combined resonant frequency corresponding to said characteristic frequency of said crystal filter.

8. An intermediate frequency amplifier arrangement as claimed in claim 5, wherein said coil and capacitor have values selected to coact with a capacitance of said transistor amplifier to give said tuning circuit and said amplifier a combined resonant frequency corresponding to said characteristic frequency of said crystal filter.

9. An intermediate frequency amplifier arrangement as claimed in claim 1, wherein said series feedback resistor and said shunt feedback resistor have selected values such that an input resistance of said amplifier matches an output resistance of said crystal filter.

10. An intermediate frequency amplifier arrangement as claimed in claim 2, wherein said series feedback resistor and said shunt feedback resistor have selected values such that an input resistance of said amplifier matches an output resistance of said crystal filter.

11. An intermediate frequency amplifier arrangement as claimed in claim 1, wherein said transistor has an emitter which is grounded by said series feedback resistor.

12. An intermediate frequency amplifier arrangement as claimed in claim 11, wherein said series feedback resistor is a sole connection between said emitter and ground.

13. An intermediate frequency amplifier arrangement as claimed in claim 2, wherein said transistor has an emitter which is grounded by said series feedback resistor.

14. An intermediate frequency amplifier arrangement as claimed in claim 13, wherein said series feedback resistor is a sole connection between said emitter and ground.

15. An intermediate frequency amplifier arrangement as claimed in claim 1, wherein said shunt feedback resistor is connected between a collector and a base of said transistor.

* * * * *